United States Patent [15] 3,660,171

Tsuchimoto et al. [45] May 2, 1972

[54] METHOD FOR PRODUCING SEMICONDUCTOR DEVICE UTILIZING ION IMPLANTATION

[72] Inventors: Takashi Tsuchimoto, Kodaira-shi; Takashi Tokuyama, Hoya-shi; Kiichi Komatsubara, Tokorozawa-shi, all of Japan

[73] Assignee: Hitachi, Ltd., Tokyo, Japan

[22] Filed: Dec. 24, 1969

[21] Appl. No.: 887,936

[30] Foreign Application Priority Data

Dec. 27, 1968 Japan....................................43/95458

[52] U.S. Cl. ....................................................148/1.5, 148/33
[51] Int. Cl. ...........................................................H01l 7/54
[58] Field of Search..............................148/1.5 CP, 186, 187

[56] References Cited

UNITED STATES PATENTS

| | | | |
|---|---|---|---|
| 3,390,019 | 6/1968 | Manchester | 148/1.5 CP |
| 3,404,451 | 10/1968 | So | 29/577 |
| 3,457,632 | 7/1969 | Dolan, Jr. et al. | 29/578 |
| 3,533,857 | 10/1970 | Mayer et al. | 148/1.5 CP |

*Primary Examiner*—L. Dewayne Rutledge
*Assistant Examiner*—J. Davis
*Attorney*—Craig, Antonelli & Hill

[57] ABSTRACT

A method for producing a transistor structure utilizing ion implantation, comprising the steps of implanting ions of base-forming impurity into a predetermined portion of a surface of a semiconductor body serving as a collector and heated to a temperature above 600° C. but below the melting point of the semiconductor to form a base region, and thereafter implanting ions of emitter-forming impurity into a predetermined portion of the surface of said base region heated to a temperature in the range of 400° to 600° C. to form an emitter region.

3 Claims, 4 Drawing Figures

Figure 1:
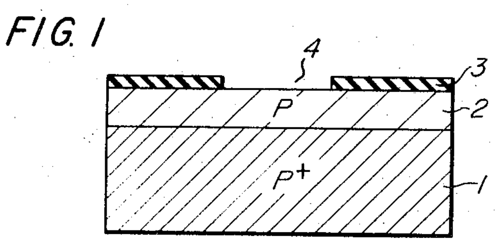

INVENTORS
TAKASHI TSUCHIMOTO, TAKASHI TOKUYAMA and
KIICHI KOMATSUBARA
BY
Craig, Antonelli, Stewart & Hill
ATTORNEYS

METHOD FOR PRODUCING SEMICONDUCTOR DEVICE UTILIZING ION IMPLANTATION

This invention relates to a method for producing a semiconductor device utilizing ion implantation, and more particularly to a method for producing a semiconductor device including two pn junctions, utilizing ion implantation into a semiconductor body heated to a desired temperature.

When impurity ions are implanted into a semiconductor body held at a room temperature, impurities implanted in the semiconductor body distribute in the semiconductor body according to Gaussian type distribution with the center at the range R from the semiconductor surface. Ion implantation also causes the generation of lattice defects which distribute with the center at a position in the neighborhood of the range R but nearer to the semiconductor surface. More particularly implanted ions elastically collide with lattice atoms near the end of the range R and generate Frenkel type defects, i.e. pairs of a vacancy and a dislocated interstitial atom, and these defects distribute near the end of the range R. Most of these defects disappear by the recombination of a vacancy and an interstitial atom if the semiconductor body is left alone at the room temperature, but some of them remain without causing recombination. This is considered to arise from the fact that many defects gather and form couplings of complicated cluster or the like. With these internal defects, a semiconductor body cannot exhibit good electrical properties.

Thus, such a semiconductor body is usually heated so that those defects disappear. This is the so-called annealing treatment and in the case of implanting boron into a silicon body the annealing temperature is from 800° to 900° C.

Alternatively, impurity ions may be implanted into a heated semiconductor body so as to achieve the same effect as an annealing treatment. In this case, lattice defects generated by the ion implantation disappear successively so if it can be considered as that ions are implanted into a semi-conductor body having no lattice defects and the annealing ends with the ending of ion implantation. This is the so-called hot implantation (cf. U.S. Pat. No. 3,390,019) In hot implantation, annealing is done before lattice defects form complex clusters and if the temperature of a semiconductor body is sufficiently high, vacancy enhanced diffusion of impurities can be observed as well as the disappearance of lattice defects formed by ion implantation.

Diffusion of impurities in silicon by the effect of heat, i.e. thermal diffusion, occurs according to the following steps. First, crystal lattices in a body are caused to vibrate by the supply of heat. The vibration of the lattice may generate vacancies in the lattice. Impurities move or diffuse in accordance with the movement or diffusion of these vacancies. Thus, the diffusion rate of impurities in a certain body depends on the density of vacancies generated in the lattice and the diffusion rate of these vacancies, and in the case of thermal diffusion of usual impurities the temperature of a body solely determines these two factors. Generation of vacancies in a body can be considered to be distributed uniformly since the whole body is held at a same temperature.

In the case of ion implantation, the density and location, i.e. distribution, of vacancies to be generated in a body is determined by the energy and species of implanted ions and the diffusion velocity of generated vacancies is determined by the heating temperature.

Vacancies can obtain a high diffusion velocity at a lower temperature as compared with that for thermal diffusion of impurities. Provided that the generation density of vacancies is sufficiently large, for example, a diffusion velocity of impurities corresponding to that for thermal diffusion at about 1200° C. can be obtained at a temperature of 600° to 700° C. when accompanied with vacancies.

As is described above, in the case of hot implantation into a semiconductor body, implanted impurities diffuse at a very high speed, being carried by vacancies so that the diffusion depth and the concentration control of impurities has conventionally been very difficult. In the case of a high frequency transistor, a junction depth of 0.3 $\mu$, and a surface impurity concentration of $10^{20}$ to $10^{21}$ atoms/cm.$^3$ are necessary for an emitter and a base width of 0.2 $\mu$ and an impurity concentration of $10^{17}$ to $10^{18}$ atoms/cm.$^3$ are necessary for a base. When such a high frequency transistor is to be formed by hot implantation, however, vacancies generated with ion implantation can be effectively minimized but it is difficult to obtain such dimensions and concentrations since implanted ions diffuse very rapidly into semiconductor body.

In the case of forming a transistor by double hot implantation according to the conventional way, it is known that the push-out effect of the base layer occurs at the time of implanting emitter impurities as is well observed in the case of thermal diffusion of impurities. This push-out effect is especially large in the case of implantation because of the existence of many vacancies.

An object of this invention is to provide an improved hot implantation method capable of controlling impurity diffused regions and obtaining accurate emitter depth, impurity concentration and base width in a transistor.

Another object of this invention is to provide a method for producing a semiconductor device utilizing hot implantation in which no push-out effect of the emitter occurs.

According to the invention, there is provided in the manufacture of a semiconductor device utilizing ion implantation by implanting ions of a first active impurity into a desired surface region of a semiconductor body of a first conductivity type to form a second conductivity type region and implanting ions of a second active impurity to form a first conductivity type region in said second conductivity type region, a method for making a semiconductor device in which in the step of implanting ions of said first active impurity into a semiconductor body, said semiconductor body is heated to a temperature sufficient for extinguishing lattice defects generated in the body by said ion implantation and for promoting solid diffusion of said first active impurity implanted, and in the step of implanting ions of said second active impurity into said second conductivity type region, said semiconductor body is heated to a temperature high enough to extinguish lattice defects (vacancies) generated in the body by the implantation of said second active impurity but not so high that implanted impurities cause solid diffusion.

The gist of the invention lies in the experimental finding that there is a gap between the temperature at which enhanced diffusion of impurities implanted in a semiconductor body begins to occur and the temperature at which lattice defects (vacancies) generated in the body begin to disappear, and in the utilization thereof for the double implantation of ions.

For example, when ions of boron, phosphor or the like are implanted into a silicon body with an energy of 100 KeV. for 20 minutes, lattice defects begin to disappear at about 400° C. but enhanced diffusion of implanted impurities does not occur below about 600° C.

Therefore, when ions of an impurity are implanted into a semiconductor body which is heated to a temperature of 400° to 600° C., they can be implanted to a depth determined by their implanting energy and also lattice defects can be extinguished. When the temperature of a semiconductor body is raised above 600° C. but below the melting point, enhanced diffusion of impurities occurs with the disappearance of lattice defects.

When ions of a first impurity are implanted into a semiconductor body about 600° C. but below the melting point of the semiconductor and those of a second impurity at a temperature of 400° to 600° C., said first impurity can be implanted at a lower temperature than that for thermal diffusion because of the enhanced diffusion and the push-out effect of the second impurity is eliminated since the second implantation is carried out at a temperature high enough to extinguish lattice defects but not sufficiently high to cause the enhanced diffusion.

A mask is used for a certain kind of ions to be selectively implanted in a semiconductor surface. Usually, a metal mask having a predetermined shape of opening is used between an ion beam source (ion implantation source) and a semiconductor body. Alternatively, an ion beam preventing film is coated on a semiconductor surface. An opening of a predetermined shape is formed in this film by a conventional method, for example, photoetching, ion or electron beam treatment, etc. An ion beam is radiated onto such a prevention film to carry out ion implantation in the exposed surface portion of the semiconductor. Such film is usually made of silicon oxide, silicon nitride, alumina or the combination thereof or a film formed of one of said material further coated with a film of Cr, Ta, Ni, etc. Further, any other material can be used for such film if fine treatment is possible and it has the required function of preventing ions.

According to the invention, the temperature ranges of a semiconductor body in the steps of the first and the second ion implantation are varied to some extent depending on the semiconductor material, impurity ions, ion energy, quantity of implanted ions but not subjected to a large change and are respectively above 600° C. and 400° to 600° C. For preventing the re-distribution of doped impurity due to thermal diffusion, the temperature is preferably limited below 800° C.

This invention will now be described in connection with the accompanying drawings.

FIGS. 1 to 4 are cross sectional views showing how a semiconductor body would appear in various steps of an embodiment of the invention.

Various manufacturing steps of a semiconductor device are illustrated in the figures in which the parts of interest are exagerated for the purpose of explanation and like reference numerals indicate like parts.

First, there is prepared a semiconductor device comprising a $p+$ type silicon substrate 1 of a specific resistivity of 0.01 Ωcm. and a p type silicon epitaxial layer 2 of a specific resistivity of 10 Ωcm. formed on a surface of the substrate 1. The thickness of the epitaxial layer 2 can be arbitrarily selected according to the case but usually is about 1 to 3$\mu$. On the exposed surface of the epitaxial layer 2, a silicon oxide film 3 is formed by the thermal decomposition of silane, thermal oxidation of the surface or the like. An opening 4 is formed in the oxide film 3 by photoetching treatment.

Figure 2:
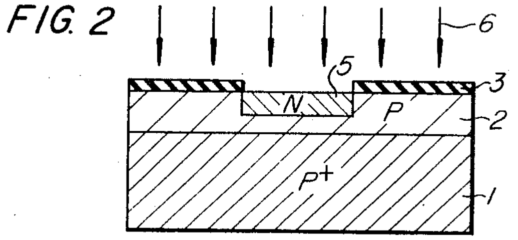

Then, ions of n type base impurity 6 are implanted into the surface of the epitaxial layer 2 to form a base layer 5 as is shown in FIG. 2. In this step, the silicon body is heated to a temperature of about 600° to 700° C. Then, implanted ions diffuse relatively rapidly and give a substantially uniform impurity distribution in the base layer. When ions are implanted into a semiconductor body not heated to such a temperature, they distribute according to Gaussian type distribution with the center at the range R from the surface. Range R is determined by the energy of ions. The existence of a highly doped layer around the center of a base layer is undesirable for a high frequency transistor.

Figure 3:
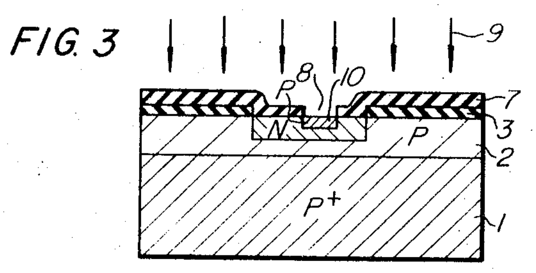

After the formation of the base layer 5 by hot implantation at 600° to 700° C., a new silicon oxide film 7 is formed on the body by the thermal decomposition of silane at 700° to 800° C., as is shown in FIG. 3. Thermal oxidation needs a temperature of about 1,000° to 12,000° C., and such a temperature causes the redistribution of impurities implanted at a relatively low temperature. Thus, thermal oxidation is not desirable in this step. An opening of a predetermined shape is formed in the oxide film 7 by photoetching. Through this opening ions of p type emitter impurity 9 (FIG. 3) are implanted into the base layer 5 to form an emitter region 10. In this implantation step, the semiconductor body is heated to a temperature of 400° to 600° C. to extinguish lattice defects but not to cause enhanced diffusion of implanted impurities. Thus, the push-out effect of the emitter can be effectively prevented.

The range of impurity ions in a semiconductor body is in proportion to the energy, i.e. accelerating voltage. Therefore, the dimensions of the base and emitter region can be relatively easily controlled. In this embodiment, phosphor ions are implanted with an energy of about 100 Kev. to a density of about $10^{15}$/cm.$^2$ to form a base region and boron ions with an energy of about 100 Kev. to a density of $10^{16}$/cm.$^2$ to form an emitter region. Under these conditions, a base region having a depth of 0.7 $\mu$ and an emitter region having a depth of 0.4 $\mu$ are formed.

For the practical use, the silicon oxide films 3 and 7 used as mask in implantation steps are unsuitable as passivation films since they are implanted with impurities. Therefore, these oxide films 3 and 7 are removed by etchant mainly composed of fluoric acid with or without a thin surface layer of the semiconductor body. Etching of a semiconductor surface brings about a good effect on the noise characteristic of the transistor and clarifies the boundaries of the collector, base and emitter regions on the semiconductor surface according to the difference in etching rate due to the difference in impurity concentration.

Figure 4:
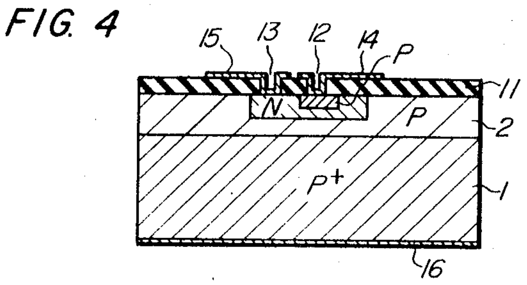

Exposing the epitaxial layer 2, a passivation film 11 consisting of silicon oxide, silicon nitride or alumina or a composite film thereof is coated thereon as is shown in FIG. 4. In the newly formed insulating film 11, openings 12 and 13 are formed to expose portions of the semiconductor surface corresponding to an emitter and base electrodes by photoetching treatment. On these exposed portions, an emitter electrode 14 and a base electrode 15 are formed. A collector electrode 16 is formed on the substrate side by nickel-plating.

Thus, a semiconductor device is manufactured.

Having now described an embodiment of the invention and since other embodiments or modifications are apparent to those skilled in the art, it is to be noted that the invention should be limited only by the following claims.

What we claim is:

1. A method for producing a semiconductor device comprising the steps of:
   - a. implanting ions of a first impurity of a first conductivity type into a semiconductor body of a second conductivity type opposite to said first conductivity type to form a first conductivity type region with the body at a temperature high enough to extinguish lattice defects formed in the body during said ion implantation and to cause enhanced diffusion of the impurity implanted in the body; and
   - b. implanting ions of a second impurity of said second conductivity type into said first conductivity type region to form a second conductivity type region with the body at a temperature different from said first mentioned temperature and high enough to extinguish lattice defects formed in the body during said second ion implantation but not high enough to cause enhanced diffusion of said second impurity implanted in the first conductivity type region.

2. A method according to claim 1, wherein said first temperature is above 600° C. but below the melting point of the semiconductor and said second temperature is in the range of 400° to 600° C.

3. A method for producing a planar type transistor comprising the steps of:
   - a. forming a mask layer having an opening on a surface of a silicon body of a first conductivity type;
   - b. bombarding an ion beam of a first active impurity onto the surface of the silicon body heated at a temperature between 600° C. and the melting point of silicon through said mask layer to form a base region in the surface of the silicon body;
   - c. forming another mask layer having an opening smaller than said opening on said mask layer and said silicon body;
   - d. bombarding an ion beam of a second active impurity onto the surface of said silicon body heated to a temperature of 400° to 600° C. to form an emitter region in said base region;
   - e. removing the mask layers from the surface of the silicon body;
   - f. forming a passivation film on the surface of the silicon body;
   - g. forming openings in the passivation film to expose electrode portions of the silicon body; and h. connecting electrodes to the electrode portions of the silicon body.

* * * * *